United States Patent [19]

Holzapfel et al.

[11] Patent Number: 4,779,231

[45] Date of Patent: Oct. 18, 1988

[54] GATE ARRAY ARRANGEMENT IN COMPLEMENTARY METAL-OXIDE-SEMICONDUCTOR TECHNOLOGY

[75] Inventors: Heinz P. Holzapfel, München; Petra Michel, Grafing, both of Fed. Rep. of Germany

[73] Assignee: Siemens Aktiengesellschaft, Berlin & Munich, Fed. Rep. of Germany

[21] Appl. No.: 937,502

[22] Filed: Dec. 3, 1986

[30] Foreign Application Priority Data

Dec. 6, 1985 [DE] Fed. Rep. of Germany ........ 3543212

[51] Int. Cl.[4] .............................................. G11C 5/06
[52] U.S. Cl. ..................................... 365/156; 365/181
[58] Field of Search ............... 365/154, 156, 174, 181, 365/190

[56] References Cited

U.S. PATENT DOCUMENTS

| 3,521,242 | 7/1970 | Katz | 365/156 |
| 4,441,169 | 4/1984 | Sasaki et al. | 365/190 |

FOREIGN PATENT DOCUMENTS

| 0119059 | 9/1984 | European Pat. Off. | |
| 0131463 | 1/1985 | European Pat. Off. | |
| 3206507 | 10/1982 | Fed. Rep. of Germany | |
| 3238311 | 4/1984 | Fed. Rep. of Germany | |
| 5864047 | 10/1981 | Japan | |
| 58139446 | 11/1983 | Japan | |
| 60-47440 | 3/1985 | Japan | |
| 60-80251 | 4/1985 | Japan | |
| 60-66447 | 4/1985 | Japan | |
| 0179994 | 9/1985 | Japan | 365/156 |

OTHER PUBLICATIONS

Asano et al., "Design of CMOS Masterslice Logic LSI", Electronics & Communications in Japan, vol. 66, No. 1, 1983, pp. 111-119.

Primary Examiner—Joseph A. Popek
Attorney, Agent, or Firm—Hill, Van Santen, Steadman & Simpson

[57] ABSTRACT

A gate array arrangement provides cell zones in the form of a matrix in a core zone of a chip. Each cell zone contains a fundamental circuit which consists of six or seven transistors designed in CMOS technology and which can perform a logic function or a storage function on the basis of appropriate interconnections. The connection of the fundamental circuits to one another is carried out either by way of the fundamental circuits or by using fundamental circuits which are not used to construct memories or logic functions. On the basis of the fundamental circuits consisting of six or seven n-channel and p-channel transistors it is possible to construct one storage cell per fundamental circuit and therefore to provide memories which can be adapted to the prevailing requirements in a gate array arrangement.

4 Claims, 8 Drawing Sheets

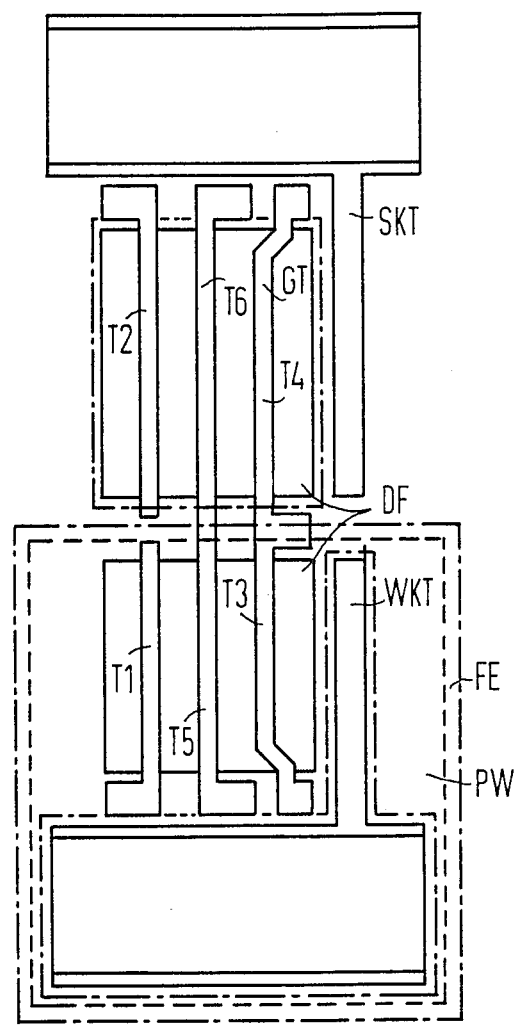

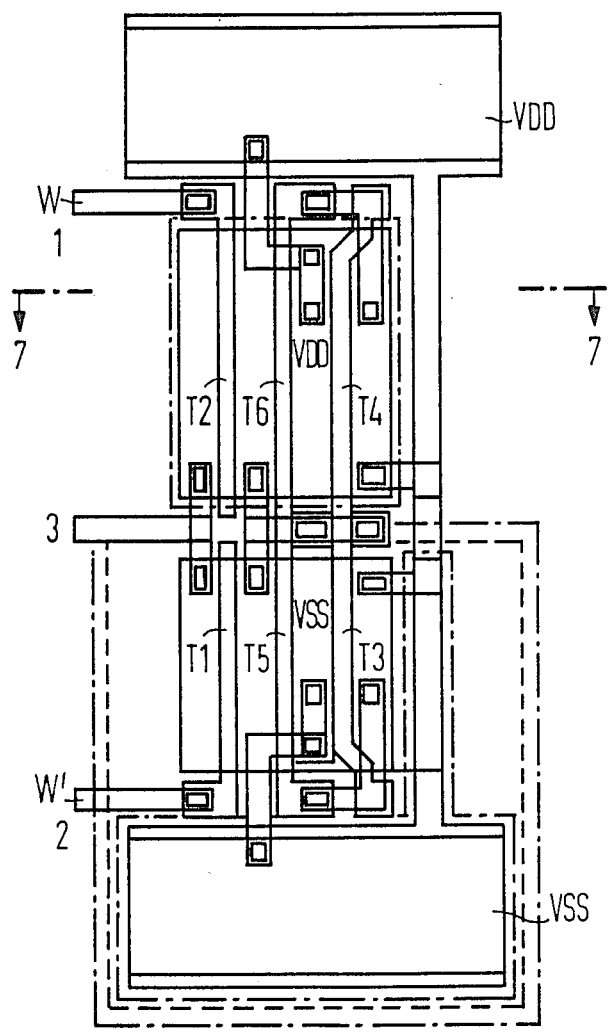

GATE ARRAY ARRANGEMENT IN COMPLEMENTARY METAL-OXIDE-SEMICONDUCTOR TECHNOLOGY

BACKGROUND OF THE INVENTION

Field of the Invention:

The present invention rleates to a gate array arrangement in complementary metal-oxide-semiconductor (CMOS) technology comprising basic circuits which are arranged on a chip at predetermined cell zones which consists of n-channel and p-channel transistors, where the transistors in the basic circuit are connected to one another in order to specify a fundamental function which is to be fulfilled and the fundamental circuits are connected to one another via wiring channels in order to fulfill functions.

Description of the Prior Art

Gate array arrangements are known, for example, from the Hitachi Review Vol. 33, No. 5, 1984, pp. 261–266. In such gate array arrangements, cell zones or cells are provided in a specific arrangement on a chip and basic circuits are constructed on the cell zones or cells. An example of a gate array arrangement of this type is disclosed in FIG. 1 in which the cell zones ZB are arranged in rows ZL in a core zone KB of a chip CH. Wiring channels VK are arranged between the rows ZL. Terminals TP and circuits of the type which cannot be constructed by way of the basic circuits can be provided on the exterior of the core zone chip.

The fundamental circuits consist of n-channel and p-channel transistors which are arranged in a specific manner in the cell zones ZB. By connecting the n-channel transistors and the p-channel transistors in each fundamental circuit, the fundamental circuit can be specified to fulfill a fundamental function and can be assigned, for example, a logic function or a storage function. It is set forth in the Hitachi Review, as referred to above, that a fundamental circuit can consist of, for example, ten transistors which are connected to one another in such a manner that a random access memory (RAM) storage cell having one input or two inputs is formed. By establishing other connections between the transistors in a fundamental circuit, it is possible to fulfill, for example, a logic function, for example NAND function.

It is necessary to connect the individual fundamental circuits in the gate array arrangement to one another in order to set up functions. This is carried out via wiring channels VK which extend between the rows ZL or which can also extend across the row ZL of the fundamental circuits.

Memories of differing capacity where previously constructed by a different method. For small capacity memory structures, bistable circuits were used. These consist of a plurality of gates and therefore require a relatively large number of fundamental circuits in a gate array to store one information unit. Large capacity memories were constructed by incorporating into the core zone of the chip a storage block of determinate capacity constructed as an overall cell. This meant that the capacity of a memory can be selected only within the stages of the storage capacity of the overall cell. Finally, the space requirement for such memories was relatively great since it was necessary to arrange wiring channels between the rows of cell zones.

SUMMARY OF THE INVENTION

The object of the present invention is to provide a gate array arrangement in which fundamental circuits are constructed which can represent both logic elements and memory elements and in which the capacity of the memory can be flexibly adapted to the prevailing requirements.

The above object is achieved, according to the present invention, in a gate array arrangement of the type set forth above which is particularly characterized in that the cell zones are arranged directly adjacent one another in the form of a matrix consisting of rows and columns, in that the wiring of the fundamental circuits to one another takes place by way of specified or non-specified basic circuits or by the utilization of non-specified basic circuits, and in that the fundamental circuits are connected either as a logic cell or as a memory cell in accordance with the requisite fundamental function.

As a result of the matrix-type arrangement of the cells zones in the core of the chip, it is possible to construct a large number of such basic circuits on the chip. Special zones are no longer provided on the chip wiring channels. The wiring is carried out either by way of specified basic circuits or non-specified basic circuits are used for the wiring. With this type of construction of the gate array arrangement, flexible storage capacities can be achieved when the transistors of a fundamental circuit are interconnected to form a storage cell.

In a first embodiment of the invention, the fundamental circuit can consist of three n-channel transistors and three p-channel transistors, where the p-channel transistors and the n-channel transistors are respectively arranged beside one another in the direction of the rows and where, in the direction of the columns, one p-channel transistor and one n-channel transistor are, in each case, arranged one above another and form a pair of transistors. In order to form RAM storage cells, it is advantageous for two transistor pairs to have a common gate terminal. In contrast, in order to form read only memories (ROM's) it is more advantageous for just one transistor pair to have a common gate terminal.

A further embodiment of the fundamental circuit can consist of three p-channel transistors and four n-channel transistors. The three p-channel transistors are arranged beside one another in the row direction and have the same channel width, while three of the n-channel transistors are arranged beside one another in the row direction and likewise have the same channel width. In each case, three n-channel transistors and three p-channel transistors are arranged one above another in the column direction, while the fourth n-channel transistor is arranged outside of that zone of the fundamental circuit formed by the three p-channel transistors and the three n-channel transistors and has a small channel width.

These fundamental circuits can be used to construct storage cells which have only one single input line by way of which input an reading occurs.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a schematic representation illustrating a first fundamental circuit consisting of six transistors;

FIG. 6 is a schematic representation illustrating the fundamental circuits 1 and 2 as illustrated in FIG. 5;

DESCRIPTION OF THE PREFERRED EMBODIMENTS

Figure 2:
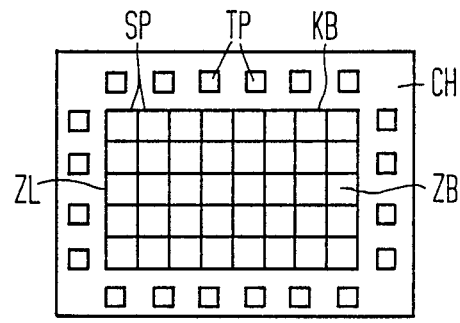
FIG. 2 is a plan view schematically illustrating a gate array arrangement of the matrix type.

FIG. 2 represents a gate array arrangement in which cell zones for the fundamental circuits are arranged on a chip CH in the form of a matrix consisting of rows ZL and columns SP. The matrix fills the entire core zone KB of the chip CH.

Figure 1:
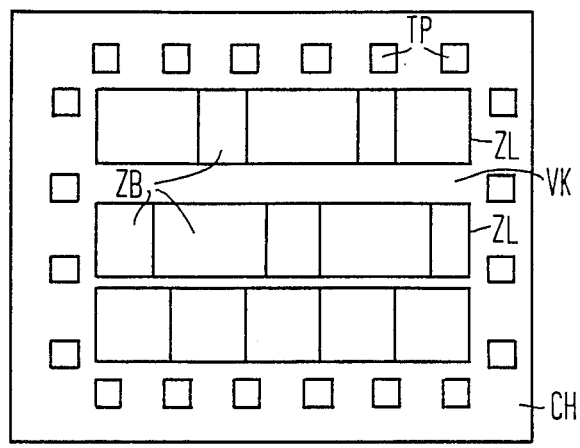
FIG. 1 is a schematic plan view of a known gate arrangement.

It can be seen by comparing FIG. 2 with FIG. 1 that in the gate array arrangement shown in FIG. 2 only fundamental circuits are arranged in the core zone. Special wiring channels as in FIG. 1 are not provided. This also dispenses with the space requirement for such wiring channels.

The fundamental circuits in the cell zones ZB can consist of, for example, six transistors as illustrated in FIG. 3. Here, three n-channel transistors T1, T3, T5 and three p-channel transistors T2, T4, T6 are provided. Both n-channel transistors and the p-channel transistors are respectively arranged beside one another in the row direction of the cell zone matrix. In the column direction of the matrix, one p-channel transistor and one n-channel transistor are each case arranged one above another. The gate terminals of the p-channel transistor T6 and the n-channel transistor T5 are connected to one another, as are the gate terminals of the p-channel transistor T4 and the n-channel transistor T3.

The other structures illustrated in FIG. 3 are known and therefore will simply be listed. The diffusion zones of the transistors are referenced DF, the gate zones GT, the p-trough for the n-channel transistors is referenced PW, the field implantation FE, the trough contact WKT, and a substrate contact SKT. Conductor paths for the potentials VDD and VSS have been referenced VDD and VSS, respectively.

Figure 4:
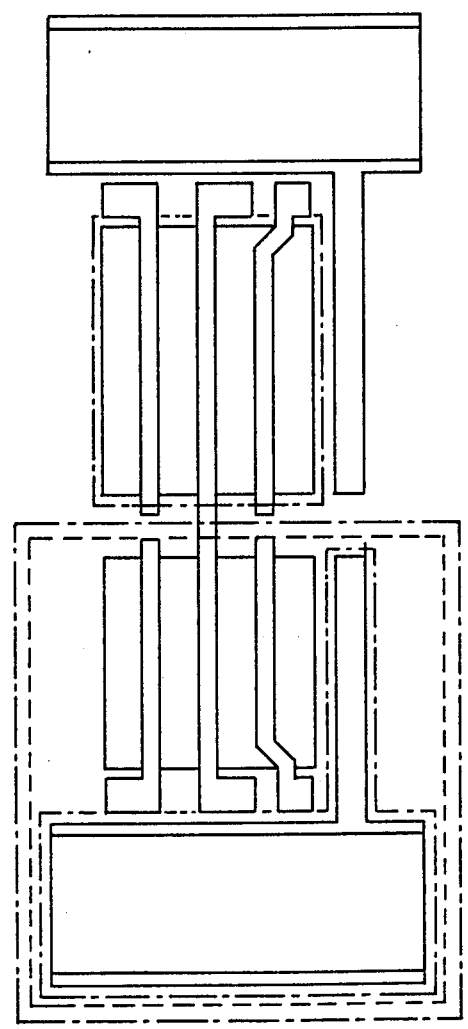
FIG. 4 is a schematic representation illustrating a second fundamental circuit consisting of six transistors.

FIG. 4 represents a second embodiment of the fundamental circuit. This embodiment differs from the embodiment of FIG. 3 only in that the p-channel transistor T4 and the n-channel transistor T3 do not have a common gate terminal. This embodiment is particularly suited for construction of read only memories.

Figure 5:
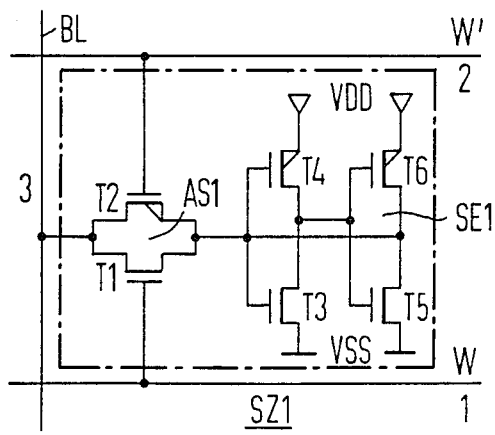
FIG. 5 is a schematic circuit diagram representing a storage cell constructed in accordance with the present invention utilizing six transistors.

A circuit of a SRAM storage cell SZ which is particularly suited for the fundamental circuits in FIG. 3 or FIG. 4 is illustrated in FIG. 5. The storage cell SZ1 consists of a storage element SE1 comprising the transistors T3, T4, T5, T6 and of the drive circuit AS1 comprising the transistors T1, T2. The storage element in FIG. 5 is known in the art, e.g. from "Integrated MOS Circuits", authored by H. Weiss and K. Horninger published by Springer-Verlag in 1982, Page 229. The drive circuit differs, however, from this art. It consists of a n-channel transistor T1 and a p-channel transistor T2, the source-drain paths of which are connected in parallel. The gate terminal of the p-transistor T2 is connected to a drive line W', whereas the gate terminal of the n-transistor T1 is connected to a drive line W. The parallel arrangement of the source-drain paths of the transistors T1 and T2 is located between the bit line BL and a common gate terminal of the transistor pair T3, T4.

The described embodiment of the drive circuit AS1 has the advantage that when an item of information is input into the storage element SE1, or when an item of information is read from the storage element SE1, the appropriate transistors T1 and T2 can be switched conductive. When input takes place into the storage cell, a drive signal is fed both to the line W and to the line W' as a result of which the two transistors T1 and T2 are switched conductive. In this manner it is possible to rapidly recharge the storage element SE1 in accordance with the item of information on the bit line BL. When an item of information is output from the storage element SE1, however, adulteration of the information contained in the storage element SE1 must be prevented. For this reason only the p-channel transistor T2 is switched conductive, which forms a relatively high resistance during reading.

Figure 8:
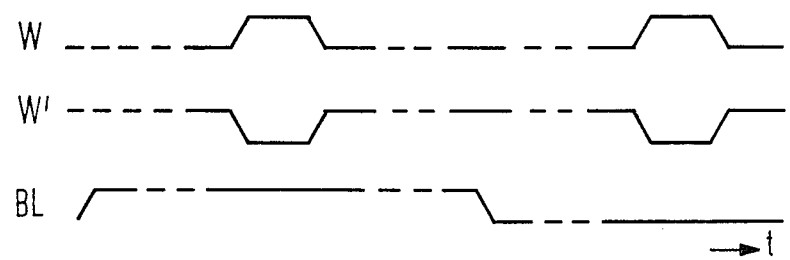
FIG. 8 is a timing diagram illustrating the input procedure in the case of the storage cell illustrated in FIG. 5.

The timing diagram of FIG. 8 represents the time conditions prevailing when an item of information is input into the storage cell as shown in FIG. 5. The signals on the drive lines W and W' and the signal on the bit line BL have been plotted over the time t. It will be seen that, first of all, the information to be input is supplied to the bit line BL which is recharged accordingly and that then signals which render the transistors T1 and T2 conductive are applied to the drive lines W and W'. During the reading process, on the other hand, only one drive signal is fed to the line W' as a result of which the p-channel transistor T2 is rendered conductive.

FIG. 6 represents the construction of the basic circuit in FIG. 3 in accordance with the storage cell as represented in FIG. 5. In FIG. 6, the transistors T1-T6 have been provided with the same designations as in the storage cell in FIG. 5. The numerals employed also correspond to those in FIG. 5. The manner in which the individual transistors are connected to one another, the transistors T4 and T6 are connected to a potential VDD and the transistors T3 and T5 are connected to a potential VSS can easily be seen. The data is in each case input into the storage element SE1 via the input 3 are read onto the bit line BL via the input 3.

Figure 7:
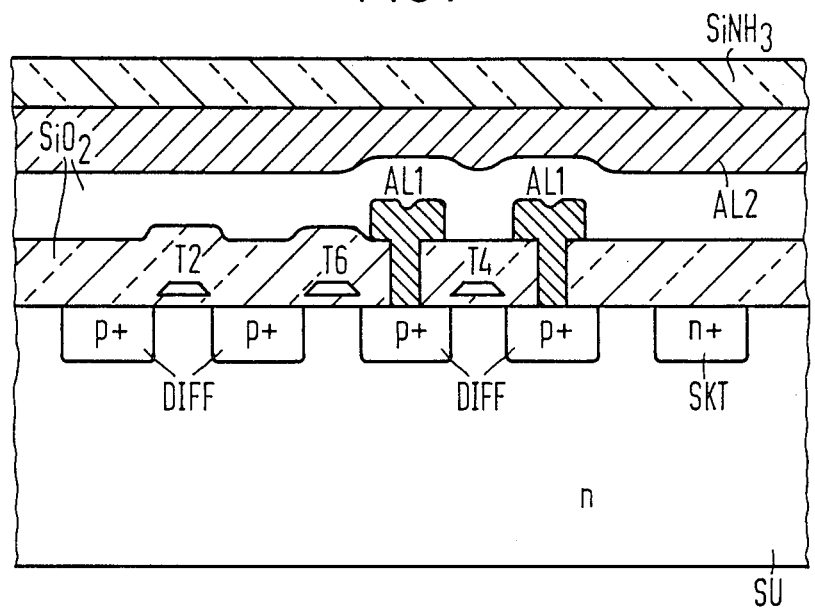
FIG. 7 is a sectional view taken along the line VII—VII of FIG. 6.

By way of further explanation, FIG. 7 represents a section taken through the storage cell as shown in FIG.

6. The entire structure is arranged in an n-substrate SU. The p-channel transistors T2, T6, T4 are arranged beside one another. The diffusion zone DIFF of the transistors T6 and T4 is connected to a line AL1 consisting of aluminum. The same applies to the other diffusion zone of the transistor T4. Above the transistors is a further line AL2 consisting of aluminum by way of which, for example, fundamental circuits or storage cells are connected to one another. The remainder of the structure of the storage cell can be seen from FIG. 7 and need not be explained further.

Figure 9:
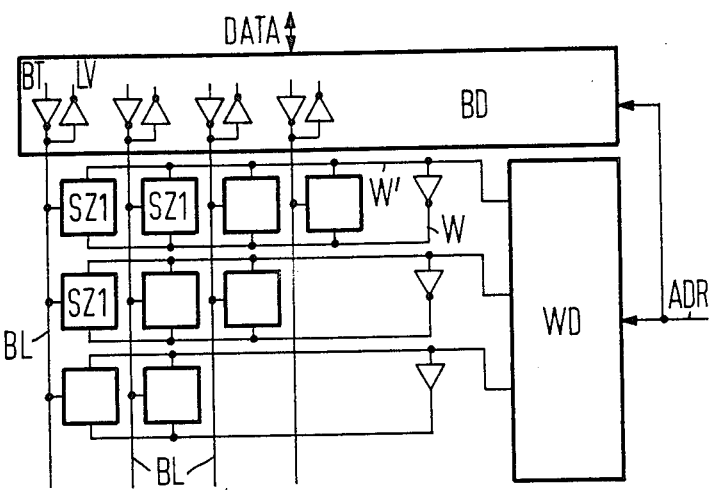
FIG. 9 is a schematic representation of a circuit which serves to drive a memory consisting of storage cells constructed in accordance with FIG. 5.

On the basis of a fundamental circuit diagram, FIG. 9 illustrates the manner in which the fundamental circuits which are arranged on the chip and which are specified as storage cells SZ can be interconnected to form a memory. Each bit line BL is connected to a bit line driver BT and a read amplifier LV. Depending on whether an item of information is to be input into the memory or read from the memory, the bit line driver BT or the read amplifier LV is activated. The read amplifier LV, bit line driver VT and other bit line decoders BD are arranged at the edge of the memory and are likewise constructed by way of the fundamental circuits. The first and second drive lines W, W' lead to a word line decoder WD by way of which required rows of the storage cells are selected. The selection takes place using an address ADR which is additionally utilized to select the bit lines.

Figure 10:
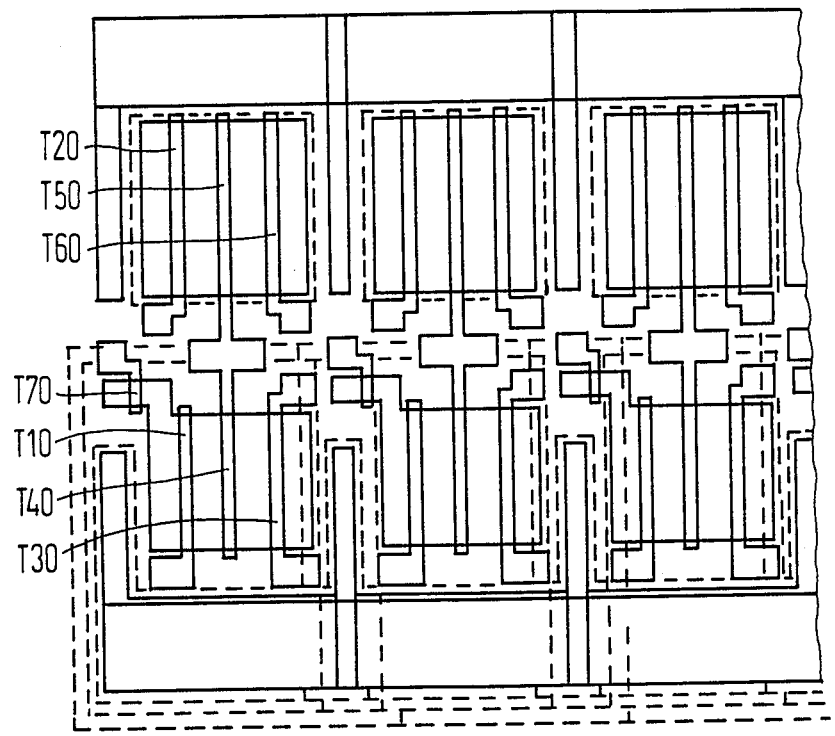
FIG. 10 is a schematic representation of a third embodiment of the fundamental circuit consisting of seven transistors.

FIG. 10 represents a third embodiment of the fundamental circuit. This consists of seven transistors, comprising four n-channel transistors and three p-channel transistors. The p-channel transistors are referenced T20, T50, T60 and all have the same channel width. Three of the n-channel transistors, those referenced T10, T30, T40 are each case arrranged beside one another in the row direction of the matrix. In the column direction, one n-channel transistor and one p-channel transistor are each case arranged one above another. In the embodiment illustrated in FIG. 10, a gate terminal of the p-channel transistor T50 is connected to the gate terminal of the n-channel transistor T40. The other structures represented in FIG. 10 are known and will not be set forth below in greater detail.

Figure 11:
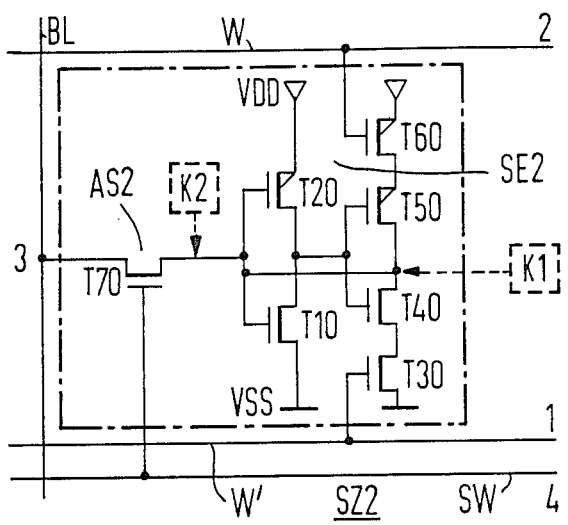
FIG. 11 is a schematic circuit diagram representing a second storage cell comprising seven transistors.

On the basis of the fundamental circuit consisting of seven transistors as shown in FIG. 10, a storage cell SZ2 are represented in FIG. 11 can be constructed. The storage cell consists of a storage element SE2 and a drive circuit AS2. This storage element differs from the storage element of FIG. 5 in that two additional transistors T30 and T60 are provided which are connected to the drive lines W and W'. The drive circuit, however, consists of a single transistor T70, namely the transistor which has the narrower channel width.

The transistor T70 operates as a data transfer transistor which, in dependence upon a selection signal on a selection line SW, switches the information in the storage element SE2 to the bit line BL or vice-versa. If information is to be input into the storage element, the transistors T30 and T60 are blocked by signals on the write line W and W' so that the inner node K1 initially retains its charge. The data transfer transistor T70 is rendered conductive. If the bit line is in a highly ohmic state, the node K2 also retains the majority of its stored charge. If the bit line BL is in a low ohmic state, the node K2 is recharged. When the write signal on the write lines W and W' disappears, the transistors T30 and T60 assume the conductive state and the transistors T50 and T40 recharge the node K1 on the basis of the charge stored at the node K2.

In comparison to the storage cell shown in FIG. 5, the circuit of the storage cells in FIG. 11 has the advantage that as a result of the transistors T30 and T60 the input procedure need not relate to the storage element so that the input procedure takes place more rapidly and more reliably and also less powerful bit line drivers suffice.

Figure 12:
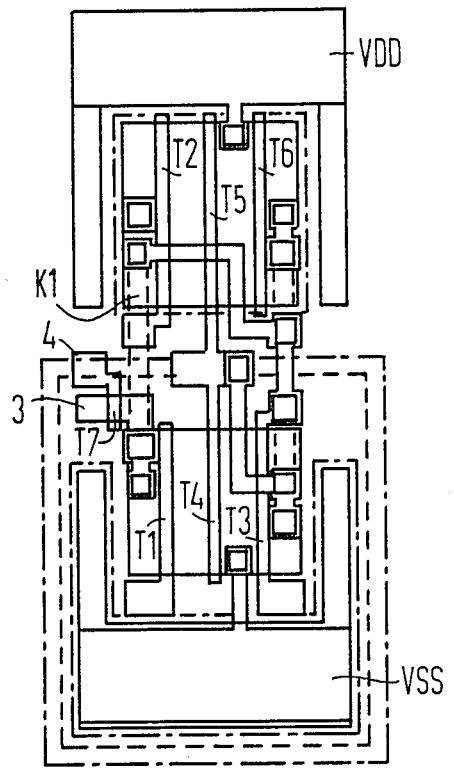
FIG. 12 is a schematic representation representing a third embodiment of the fundamental circuit in accordance with the storage cell illustrated in FIG. 11.

The specification of the fundamental circuit in FIG. 10 in accordance with the storage cell as shown in FIG. 11 is represented in FIG. 12. The manner in which the transistors are connected to one another and be clearly seen from FIG. 12. FIG. 12 also illustrates the manner in which the transistors T60, T30 are connected to the potentials VDD and VSS, respectively, and the manner in which the selection line SW and the bit line BL are connected to the data transfer transistor T70.

Figure 13:
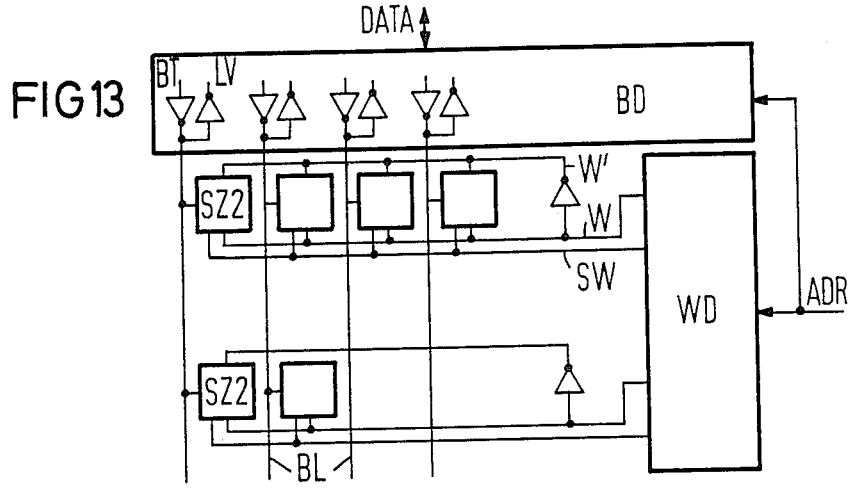
FIG. 13 is a schematic circuit diagram illustrating a circuit which serves to drive a memory consisting of storage cells of the type illustrated in FIG. 10.

The fundamental construction of a memory from the storage cells SZ2 corresponding to FIG. 11 can be seen from FIG. 13. The difference with respect to the memory shown in FIG. 9 is that here the selection line SW is required in addition to the write lines W and W'. The bit lines are again connected to bit line drivers BT and read amplifiers LV for the input or reading of an item of information. The bit lines and the write lines and selection lines are selected by way of an address ADR which is supplied to a bit line decoder BD and to a word line decoder WD.

The fundamental circuits of FIGS. 3, 4 and 10 can be used to construct a read only memory (ROM). The embodiment in FIG. 3 can be used to construct two storage elements in respect of each fundamental circuit, the embodiment of FIG. 4 can be used to construct four storage elements and the embodiment of FIG. 10 can likewise be used to construct four storage elements.

Figure 14:
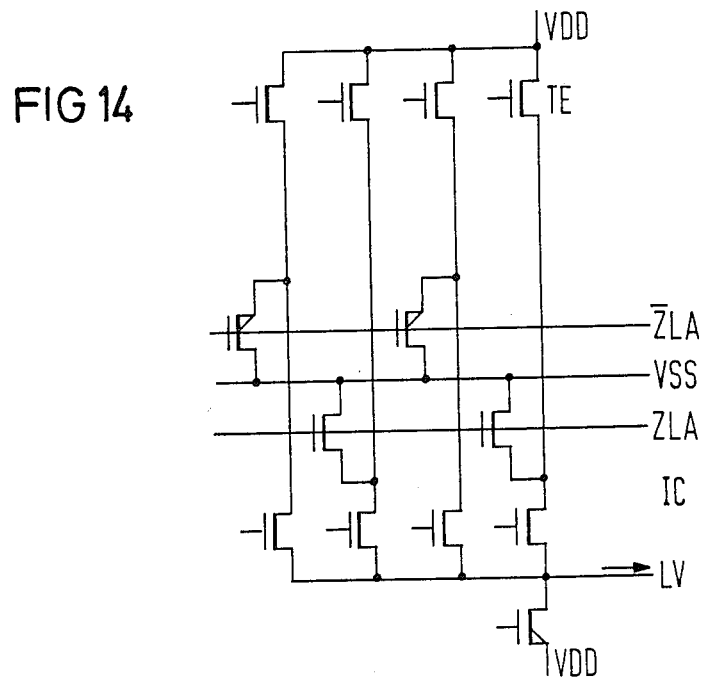
FIG. 14 is a schematic circuit diagram representing the construction of a read only memory by way of the storage cells illustrated in FIG. 5 or in FIG. 11.

FIG. 14 represents the construction of the fundamental circuit as a four-bit ROM cell, where the construction can be effected via diffusion contacts or gate contacts. The fundamental principle of the circuit is that the column lines SL are precharged in a charging clock signal via precharging transistors Te, that then the read signals are connected to the row lines ZLA or ZLA', and that, finally, by way of column selection transistors TC the column lines are evaluated with the assistance of read amplifiers. The signal on the row lines ZLA, ZLA' discharge the corresponding column line only when the gate of the transistor arranged at the intersection point of column and row lines (as in FIG. 14) is connected to the row line or the source of the transistor is connected to the column line SL. If this is not the case, the corresponding column line is not discharged.

The programming of the memory cells can therefore take place via gate contacts to the row lines ZLA or ZLA', by connecting a potential corresponding to a binary "0" or binary "1" to the gate terminals, or by contacting or non-contacting the source terminal of the transistors to the column lines when the gate terminals are connected to the row lines. As the fundamental circuits contain both p-channel transistors and n-channel transistors which can be used as storage elements, the row selection signal must be supplied to the row line ZLA' in inverted form and to the row line ZLA in non-inverted form.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a gate array arrangement of the type in which basic circuits are arranged on an integrated circuit chip in predetermined cell zones and comprise p-channel and n-channel transistors which form a read-only memory, the improvement wherein:

the cell zones are arranged beside one another in a matrix of columns and rows;

the basic circuits are interconnected by connection circuits to define a basic function to be fulfilled;

each of said basic circuits comprising a storage cell including a storage element, columns lines and row selection lines;

said storage element comprising first, second, third and fourth field effect transistors, each of said transistors including first and second terminals having a controlled conduction path therebetween and a gate terminal, said first and third transistors being p-channel transistors and said second and fourth transistors being n-channel transistors, said first terminals of said first and second transistors connected together and to a first fixed potential and said first terminals of said third and fourth transistors connected together and to the first fixed potential, said second terminal of said first and third transistors connected to a second fixed potential via respective column lines and said second terminal of said fourth transistor connected to the second fixed potential, said gate terminals of said transistors selectively connected to said first and second row selection lines depending on the information to be stored;

clocked precharging transistors each including first and second terminals having a controlled conduction path therebetween, and a clocked gate terminal, each of said precharging transistors connecting a respective column line to the second fixed potential; and selectively operable column selection transistors each connecting a respective column line to the second fixed potential.

2. In a gate array arrangement of the type in which basic circuits are arranged on an integrated circuit chip in predetermined cell zones and comprise p-channel and n-channel transistors, the improvement wherein:

the cell zones are arranged beside one another in a matrix of columns and rows; and the basic circuits are interconnected by connection circuits to define a basic function to be fulfilled, each of said basic circuits comprising first, second and third p-channel transistors and first, second, third and fourth n-channel transistors, said first, second and third p-channel transistors being arranged beside one another in the row direction and each having the same channel width, said first, second and third n-channel transistors arranged beside one another in the row direction and each having the same channel width, in the column direction, at least one n-channel transistor and at least one p-channel transistor arranged beside one another, and said fourth n-channel transistor having a narrower channel width and arranged outside of the zone occupied by the three p-channel transistors and the three n-channel transistors.

3. In a gate array arrangement of the type in which basic circuits are arranged on an integrated circuit chip in predetermined cell zones and comprise p-channel and n-channel transistors, the improvement wherein:

the cell zones are arranged beside one another in a matrix of columns and rows; and the basic circuits are interconnected by connection circuits to define a basic function to be fulfilled, each of said basic circuits comprising a storage cell including a storage element, a data transfer element, a bit line, first and second write lines, and a drive line;

said storage element comprising first, second, third and fourth field effect transistors, each of said transistors including first and second terminals having a controlled conduction path therebetween and a gate terminal, said first and third transistors being p-channel transistors and said second and fourth transistors being n-channel transistors, said first terminals of said first and second transistors connected together and said first terminals of said third and fourth transistors connected together, said second terminal of said third transistor connected to a first fixed potential and said second terminal of said fourth transistor connected to a second fixed potential, said gate terminals of said first and second transistors connected to said first terminals of said third and fourth transistors and said gate terminals of said third and fourth transistors connected to said first terminals of said first and second transistors, fifth and sixth transistors each including first and second terminals having a controlled conduction path therebetween, and a gate terminal, said fifth transistor being a p-channel transistor and said sixth transistor being an n-channel transistor, said second terminal of said fifth transistor connected to said second terminal of said first transistor, and said second terminal of said sixth transistor connected to said second terminal of said second transistor, said first terminal of said fifth transistor connected to the first fixed potential and said first terminal of said sixth transistor connected to the second fixed potential, said gate terminal of said fifth transistor connected to said first write line and said gate terminal of said sixth transistor connected to said second write line, and said data transfer element comprising a seventh transistor including first and second terminals having a controlled conduction path therebetween, and a gate terminal, said first terminal connected to said bit line, said second terminal connected to said gate terminal of said third and fourth transistors and to said first terminals of said first and second transistors, and said gate terminal of said seventh transistor connected to said drive line.

4. The improved gate array arrangement of claim 3, and further comprising:

means for writing information into said storage element connected to said first and second write lines and to said drive line, said means operable to provide a first signal on said first and second write lines to block said fifth transistor and to apply a drive signal to said drive line to render said seventh transistor conductive and cause data transfer from said bit line to said storage element, and further to modify the signal state on said first and second write lines to render said fifth transistor conductive again and to remove said drive signal from said drive line to block said seventh transistor

* * * * *